United States Patent
Petigny et al.

(10) Patent No.: US 8,730,072 B2
(45) Date of Patent: May 20, 2014

(54) INTERLEAVED ADC CALIBRATION

(71) Applicant: STMicroelectronics (Grenoble 2) SAS, Grenoble (FR)

(72) Inventors: Roger Petigny, Meylan (FR); Hugo Gicquel, Grenoble (FR); Fabien Reaute, Renage (FR)

(73) Assignee: STMicroelectronics (Grenoble 2) SAS, Grenoble (FR)

( * ) Notice: Subject to any disclaimer, the term of this patent is extended or adjusted under 35 U.S.C. 154(b) by 0 days.

(21) Appl. No.: 13/667,977

(22) Filed: Nov. 2, 2012

(65) Prior Publication Data

US 2013/0106631 A1 May 2, 2013

(30) Foreign Application Priority Data

Nov. 2, 2011 (FR) ..................................... 11 59925

(51) Int. Cl.
*H03M 1/10* (2006.01)
*H03M 1/12* (2006.01)
*H03M 1/36* (2006.01)

(52) U.S. Cl.
CPC . *H03M 1/10* (2013.01); *H03M 1/12* (2013.01); *H03M 1/36* (2013.01)
USPC .......................................... 341/120; 341/155

(58) Field of Classification Search
CPC ............ H03M 1/10; H03M 1/12; H03M 1/36
USPC .......................................... 341/120, 155, 159
See application file for complete search history.

(56) References Cited

U.S. PATENT DOCUMENTS

| | | | | |
|---|---|---|---|---|
| 5,294,926 A | * | 3/1994 | Corcoran | ....................... 341/120 |
| 6,567,022 B1 | * | 5/2003 | Reuveni et al. | ............... 341/120 |
| 6,809,668 B2 | | 10/2004 | Asami | |
| 6,873,281 B1 | | 3/2005 | Esterberg et al. | |
| 7,227,479 B1 | | 6/2007 | Chen et al. | |
| 7,834,786 B2 | * | 11/2010 | Kawahito et al. | ............. 341/120 |
| 7,843,370 B2 | * | 11/2010 | Chen | ............................. 341/120 |
| 7,847,713 B2 | * | 12/2010 | Nam et al. | .................... 341/120 |
| 7,894,728 B1 | | 2/2011 | Sun et al. | |
| 8,466,818 B1 | * | 6/2013 | Johancsik et al. | ............ 341/122 |

FOREIGN PATENT DOCUMENTS

| EP | 1821413 A1 | 8/2007 |
|---|---|---|
| EP | 2211468 A1 | 7/2010 |

OTHER PUBLICATIONS

Dyer et al., "An Analog Background Calibration Technique for Time-Interleaved Analog-to-Digital Converters," *IEEE Journal of Solid-State Circuits* 33(12):1912-1919, Dec. 1998.

* cited by examiner

*Primary Examiner* — Brian Young
(74) *Attorney, Agent, or Firm* — Seed IP Law Group PLLC

(57) ABSTRACT

The present disclosure includes calibration circuitry for adjusting the bandwidth of at least one sub-converter of an interleaved analog to digital converter (ADC), the at least one sub-converter having an input switch coupled to an input line of the ADC, the calibration circuitry having a control circuit adapted to adjust a bulk voltage of a transistor forming the input switch.

14 Claims, 4 Drawing Sheets

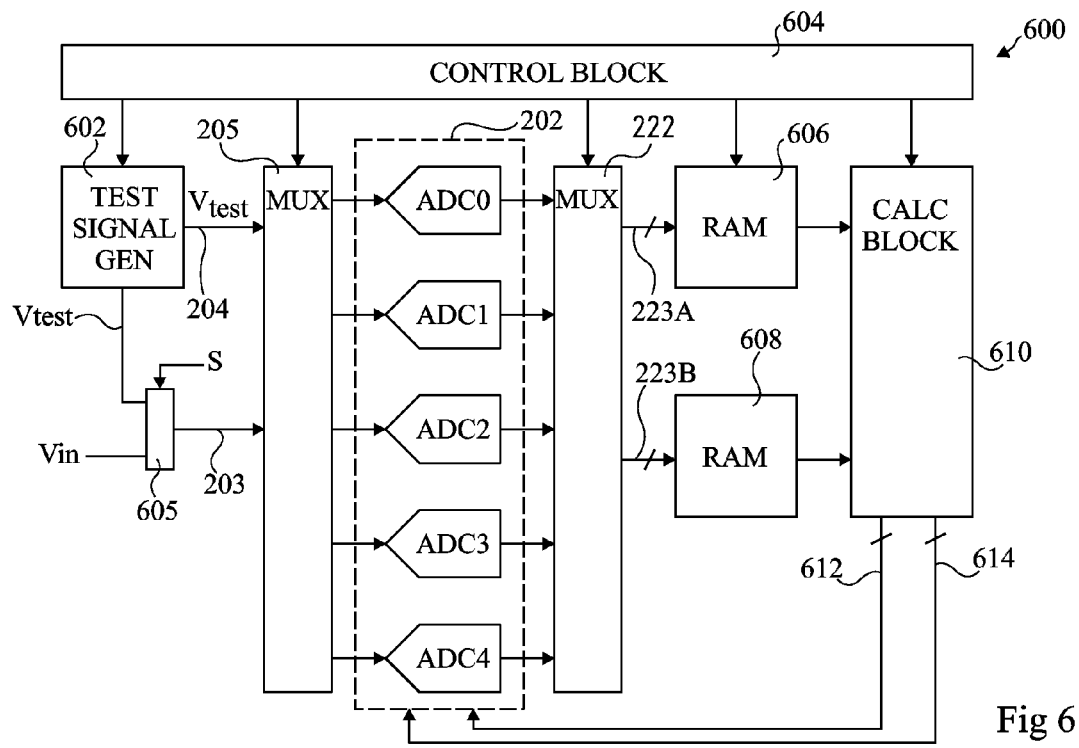
Fig 6
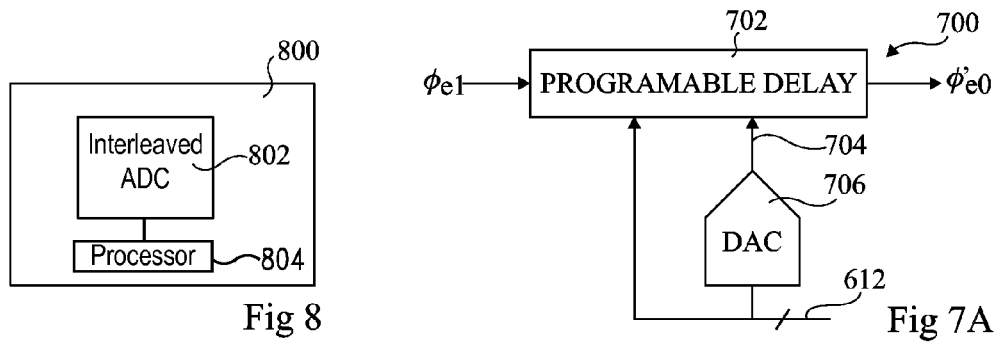
Fig 8
Fig 7A
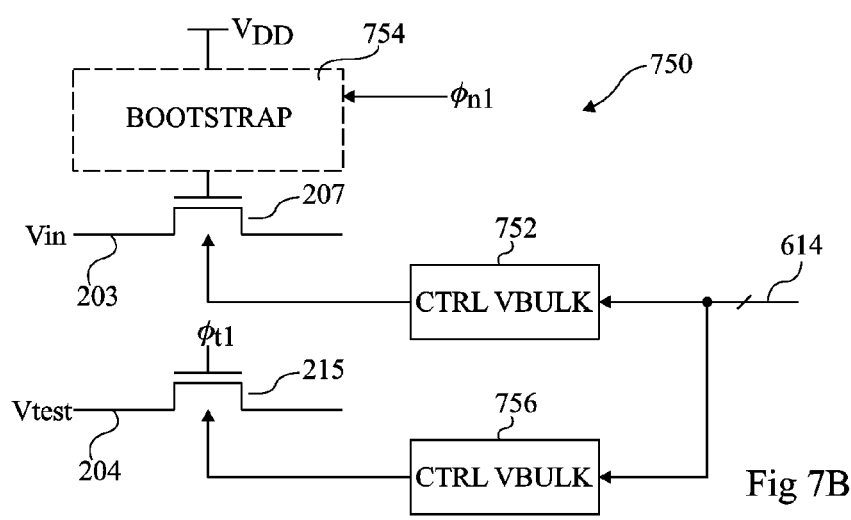
Fig 7B

INTERLEAVED ADC CALIBRATION

BACKGROUND

1. Technical Field

The present disclosure relates to an interleaved analog-to-digital converter (ADC) and to a method of performing an analog-to-digital conversion.

2. Description of the Related Art

FIG. 1 illustrates an example of an interleaved ADC comprising four sub-converters ADC1 to ADC4. Each of the sub-converters is coupled to an input line 102 via a corresponding switch 104 to 107 controlled by a respective timing signal $\phi 1$ to $\phi 4$ having respective phase offsets. Thus each of the sub-converters ADC1 to ADC4 samples an input signal Vin on the input line 102 at a different time, and provides a corresponding output signal D1 to D4 to respective inputs of a multiplexer (MUX) 108. Multiplexer 108 generates an output data signal Dout on a line 110 by periodically selecting each of the output signals D1 to D4 in turn.

Thus, by providing the four time-interleaved sub-converters ADC 1 to ADC4, the input signal Vin can be sampled at four times the rate of a single ADC, and thus the sampling frequency Fs can be four times as high.

In order to obtain a high quality digital output signal Dout, it would be desirable that the sub-converters ADC1 to ADC4 are well matched with each other, for example in terms of their respective voltage offsets and gains. However, these parameters may vary, for example due to PVT (process, voltage, temperature) variations, or other factors.

In order to correct such miss-matches, one option would be to provide a calibration phase for each sub-converter. However, a problem with such a solution is that it involves an interruption in the operation of the interleaved ADC or a reduction in its sampling frequency, either of which is undesirable due to the resulting reduction in performance/quality of the interleaved ADC.

There are also technical problems in calibrating the sub-converters to efficiently correct a miss-match without introducing further noise.

BRIEF SUMMARY

According to one aspect, there is provided calibration circuitry for adjusting the bandwidth of at least one sub-converter of an interleaved analog to digital converter, said at least one sub-converter having an input switch coupled to an input line of said ADC, the calibration circuitry comprising a control circuit adapted to adjust a bulk voltage of a transistor forming said input switch.

According to one embodiment, the calibration circuitry further comprises a calculation block adapted to compare test data of at least two of said sub-converters, and to generate a control signal to the control circuit based on said comparison.

According to another embodiment, the calibration circuitry further comprises a first memory coupled to said calculation block and adapted to store test data from a first of said at least one sub-converters, and a second memory coupled to said calculation block and adapted to store test data from a second of said at least one sub-converters.

According to another embodiment, the calibration circuitry further comprises a bootstrap circuit adapted to generate a gate voltage of said transistor based on a timing signal.

According to another embodiment, the input line is adapted to receive an input signal of said interleaved ADC, and said at least one sub-converter has a further input switch coupled to a further input line for receiving a test signal, the calibration circuitry further comprising a further control circuit adapted to adjust a bulk voltage of a transistor forming said further input switch.

According to another embodiment, the calibration circuitry further comprises a test signal generator configured to generate a test signal at a test frequency to be applied to said at least one sub-converter.

According to another embodiment, the test signal generator comprises at least one of: a phase-locked loop; and a digital to analog converter.

According to another embodiment, the calibration circuitry further comprises a switching block adapted to select between the test signal and an input signal, and to apply the selected signal to said at least one sub-converter.

According to a further aspect, there is provided an interleaved analog to digital converter comprising first and second sub-converters, and the above calibration circuitry.

According to a further aspect, there is provided a method of calibrating the bandwidth of at least one sub-converter of an interleaved analog to digital converter, the at least one sub-converter having an input switch coupled to an input line of said ADC, the method comprising: adjusting a bulk voltage of a transistor forming the input switch.

BRIEF DESCRIPTION OF THE SEVERAL VIEWS OF THE DRAWINGS

The foregoing and other purposes, features, aspects and advantages of embodiments of the present disclosure will become apparent from the following detailed description of embodiments, given by way of illustration and not limitation with reference to the accompanying drawings, in which:

FIG. 6 illustrates an interleaved ADC according to a further example embodiment of the present disclosure;

FIG. 7A illustrates calibration circuitry according to an example embodiment of the present disclosure;

FIG. 7B illustrates calibration circuitry according to the further example embodiment of the present disclosure; and FIG. 8 illustrates an electronic device according to an embodiment of the present disclosure.

DETAILED DESCRIPTION

Throughout the following description, only those elements useful for an understanding of the various embodiments will be described in detail. Other aspects, such as the particular type and form of the analog to digital conversion circuitry, have not been described in detail, the following embodiments applying to a wide range of converter types, such as pipeline converters or SAR (successive approximation register) ADCs.

Figure 1:
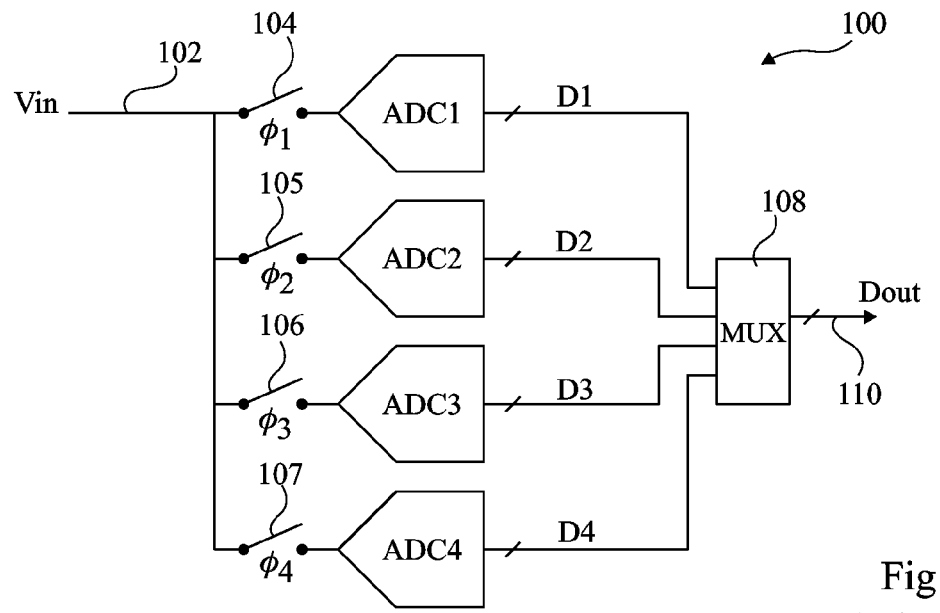
FIG. 1 illustrates a known example of an interleaved ADC.
Figure 2:
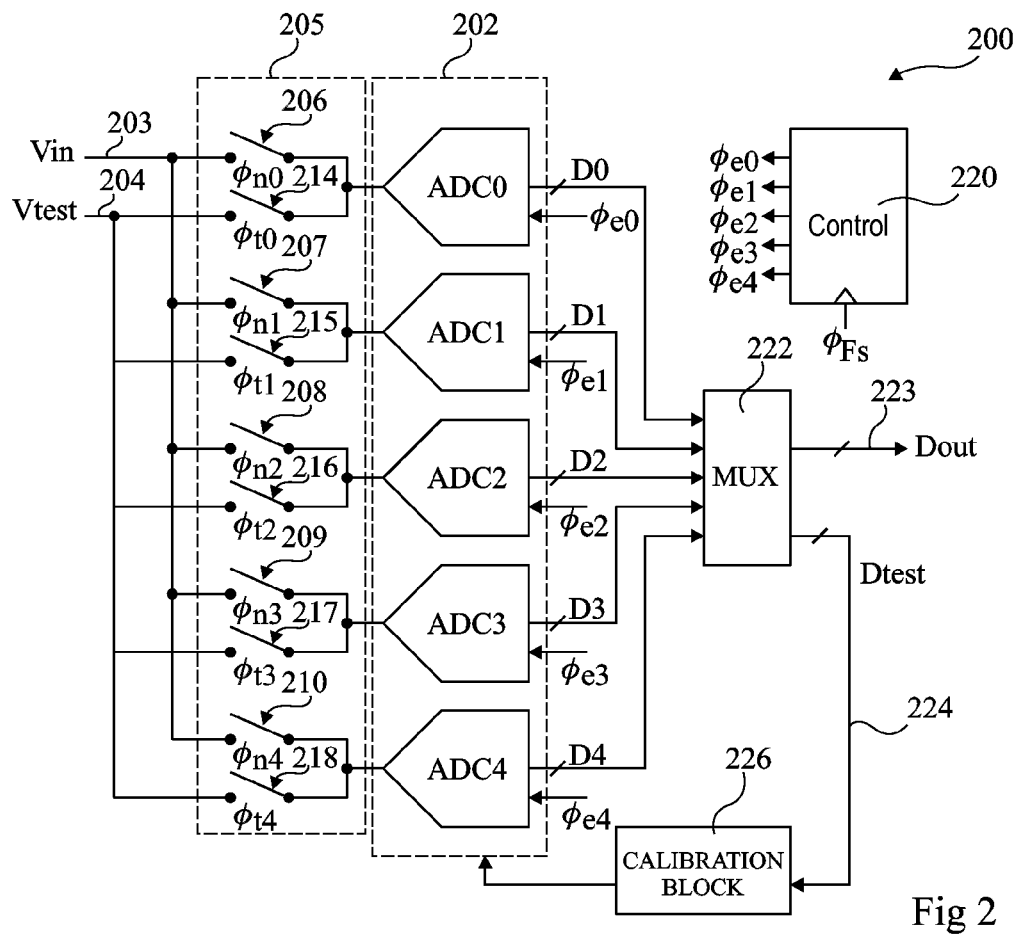
FIG. 2 illustrates an interleaved ADC according to an example embodiment of the present disclosure.

FIG. 2 illustrates an interleaved ADC 200 according to an example embodiment. ADC 200 has four sub-converters operating in parallel to sample an input signal Vin, but comprises a converter block 202 comprising five sub-converters ADC0 to ADC4. This hardware redundancy allows one of the sub-converters to be periodically taken off-line for testing, without disrupting the sampling sequence of the input signal.

The input of each sub-converter ADC0 to ADC4 is coupled to each of a pair of input lines 203 and 204 via a multiplexer 205. The input line 203 receives an analog input signal Vin to be converted, while the input line 204 receives an analog test signal Vtest to be applied to a sub-converter under test.

The multiplexer 205 comprises switches 206 to 210 coupling the sub-converters ADC0 to ADC4 respectively to the input line 203, and switches 214 to 218 coupling the sub-converters ADC0 to ADC4 respectively to the input line 204. Switches 206 to 210 are controlled by timing signals $\phi_{n0}$ to $\phi_{n4}$, while the switches 214 to 218 are controlled by timing signals $\phi_{t0}$ to $\phi_{t4}$. Each of the sub-converters ADC0 to ADC4 also receives a timing signal $\phi_{e0}$ to $\phi_{e4}$, which controls the sampling time of each sub-converter. These signals are generated by a control block 220, based on a clock signal $\phi_{Fs}$, which is for example a clock signal at the sampling frequency Fs.

Outputs D0 to D4 of the sub-converters ADC0 to ADC4 are supplied to corresponding inputs of a multiplexer (MUX) 222, which selects certain outputs in turn to form an output data signal Dout on an output line 223. The multiplexer 222 also provides a test output signal Dtest on lines 224 to a calibration block (CALIBRATION BLOCK) 226. Signal Dtest corresponds to the output of the sub-converter that is being tested at a given time. The calibration block 226 generates a control signal in response to the test output signal, which is used to calibrate one or more of the sub-converters ADC0 to ADC4 of block 202, as will be described in more detail below.

The test signal Vtest on line 204 and the resulting test data Dtest provided to the calibration block 226 for example allow one or more of an offset voltage, gain, static skew and bandwidth measurement to be made. The calibration block 226 is adapted to make the appropriate correction to the corresponding sub-converter, as will be described in more detail below.

The number of bits forming each output signal D0 to D4 and each of the output data signals Dout and Dtest will depend on the size of the sub-converters ADC0 to ADC4, and could be any number equal to or greater than 2.

Of course, while FIG. 2 illustrates the example of five sub-converters, more generally there could be N+M sub-converters, where N is the number of sub-converters operating in parallel at any one time, in other words N is the number of times the input signal is sampled during the conversion cycle of one converter. For example, N could be any number equal to or greater than 2. M is the number of additional sub-converters, which could be equal to 1, or in some embodiments could be greater than 1, if for example it is desired to provide some back-up converters to be used if one of the sub-converters becomes non-operational.

Figure 3:
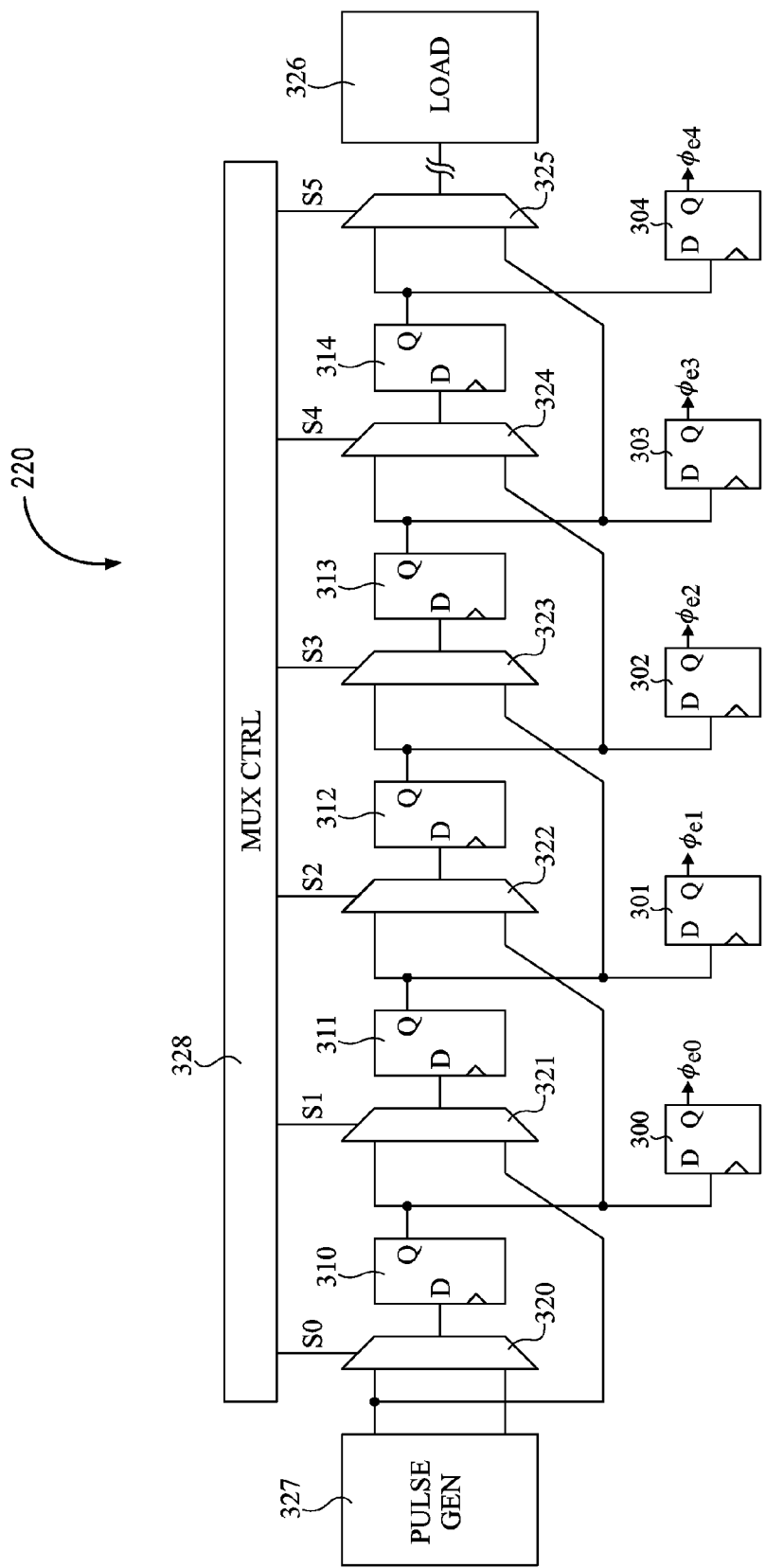
FIG. 3 illustrates a control block of the interleaved ADC of FIG. 2 in more detail according to an example embodiment of the present disclosure.

FIG. 3 illustrates the control block 220 of FIG. 2 in more detail according to one embodiment.

As illustrated, the timing signals $\phi_{e0}$ to $\phi_{e4}$ are provided at outputs of five corresponding D-type flip-flops 300 to 304 respectively. Each of these flip-flops 300 to 304 receives at its data input the Q output of a respective D-type flip-flop 310 to 314. Five two-input multiplexers 320 to 324 have their outputs coupled to the data inputs of flip-flops 310 to 314 respectively. Multiplexer 320 is optional, and performs the role of providing balance to the input side of the circuit, such that the input node of D-type flip-flop 310 has similar characteristics to the other flip-flops 311 to 314. A further two-input multiplexer 325 is also optional, and for example has its output coupled to a load block (LOAD) 326 and its first and second inputs coupled to the Q output of D-type flip-flops 313 and 314 respectively. Load block 326 for example has input characteristics similar to those of a D-type flip-flop. Thus the multiplexer 325 and load block 326 perform the role of balancing the circuit such that the output nodes of D-type flip-flops 313 and 314 have similar characteristics to the output nodes of the other flip-flops 310 to 312. Both inputs of multiplexer 320 are coupled to respective outputs of a pulse generation block (PULSE GEN) 327. First inputs of multiplexers 321 to 324 are respectively coupled to the Q outputs of flip-flops 310 to 313. The second input of multiplexer 321 is coupled to the same output of the pulse generation block 327 as the first input of multiplexer 320. The second inputs of multiplexers 322 to 324 are coupled to the Q outputs of flip-flops 310 to 312 respectively. The multiplexers 320 to 325 are controlled by control signals S0 to S5 respectively, which are provided by a multiplexer control block (MUX CTRL) 328.

Each of the D-type flip-flops 300 to 304 and 310 to 314 is for example timed by the clock signal $\phi_{Fs}$ (not illustrated in FIG. 3).

The implementation of the control block 220 of FIG. 3 is adapted to the example of five sub-converters, but of course it will be apparent to those skilled in the art that this circuitry could be scaled for a different number of sub-converters, by adding flip-flops and multiplexers between multiplexer 325 and load 326, or by removing one or more of the multiplexers and flip-flops.

Operation of the circuit of FIG. 3 will now be described with reference to the timing diagram of FIG. 4.

Figure 4:
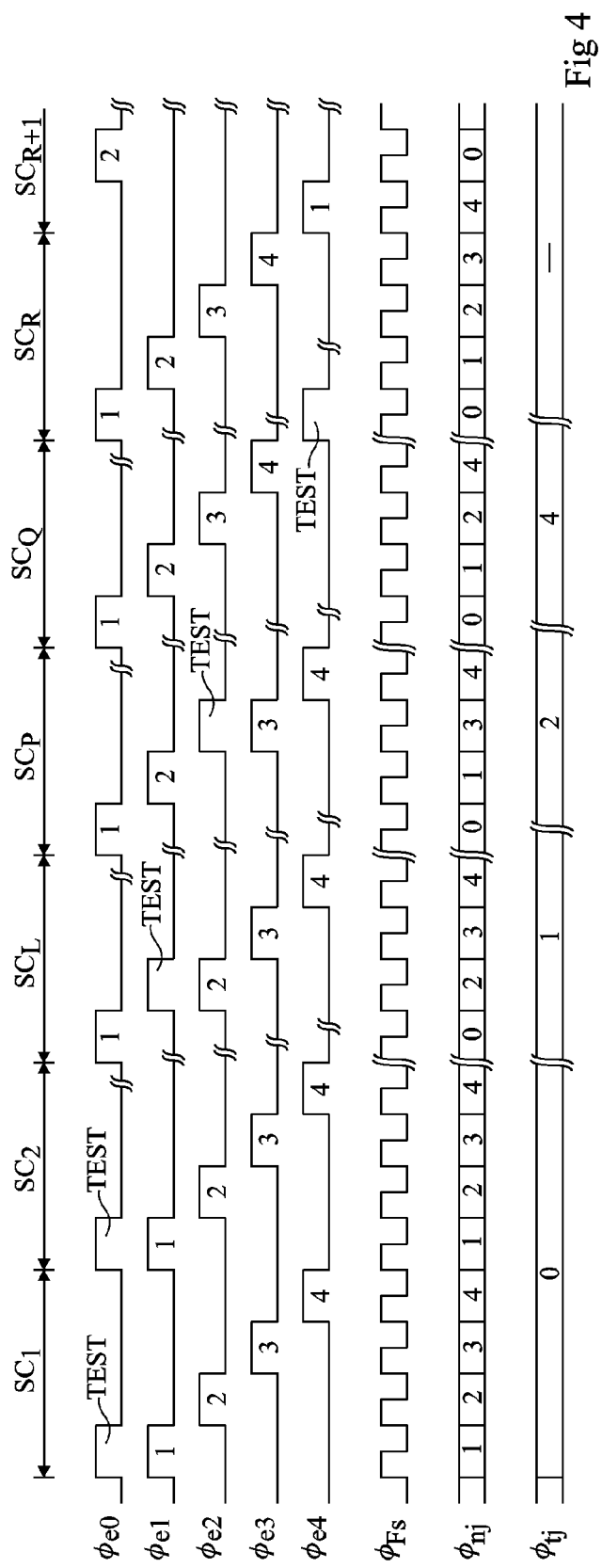
FIG. 4 is a timing diagram illustrating timing pulses in the circuitry of FIG. 3 according to an example embodiment of the present disclosure.

FIG. 4 illustrates the example of the timing signals $\phi_{e0}$ to $\phi_{e4}$ and $\phi_{Fs}$, and the corresponding switch control signals $\phi_{n0}$ to $\phi_{n0}$ and $\phi_{t0}$ to $\phi_{t4}$, which are shown grouped together on rows labeled $\phi_{nj}$ and $\phi_{tj}$ in FIG. 4.

In the example of FIG. 4, the sub-converters ADC0 to ADC4 of FIG. 2 are each tested in turn over a number of sampling cycles. The pulse generator block 327 generates a pulse on its first output to trigger each sampling cycle.

During a first sampling cycle $SC_1$, the sub-converter ADC0 is tested, and sub-converters ADC1 to ADC4 perform sampling of the input signal Vin. Thus, during cycle $SC_1$, the signal $\phi_{t0}$ is high. During the first sampling cycle, multiplexers 320 and 322 to 325 are controlled by control signals S0 and S2 to S5 respectively to select their first inputs, while multiplexer 321 is controlled to select its second input, coupled to the output of pulse generator block 327. Thus, pulse generator block 327 generates a pulse to trigger the first sampling cycle $SC_1$, and two periods of the clock signal $\phi_{Fs}$ later, the control signals $\phi_{e0}$ and $\phi_{e1}$ will have high pulses occurring at the same time. The pulse of sampling signal $\phi_{e0}$ is a test pulse controlling sub-converter ADC0 to sample the test signal Vtest. The pulse of sampling signal $\phi_{e1}$ is a first sampling period "1" of the input signal Vin during the sampling cycle $SC_1$, and thus signal $\phi_{n1}$ is high.

Although not shown in FIG. 4, at the same time as sampling signals $\phi_{e0}$ and $\phi_{e1}$ go high, the signal at the output of flip-flop 312 will go high. Thus, on the subsequent rising edge of the clock signal $\phi_{Fs}$, the sampling signal $\phi_{e2}$ at the output of flip-flop 302 will go high, which is labeled as a sampling period "2" of the sampling cycle $SC_1$, and the signal $\phi_{n2}$ is high. The output of flip-flop 313 will also go high, such that on the subsequent rising edge of clock signal $\phi_{Fs}$, the sampling signal $\phi_{e3}$ at the output of flip-flop 303 will go high, which is labeled as a sampling period "3" of the sampling cycle $SC_1$, and signal $\phi_{n3}$ is high. The output of flip-flop 314 will also go high, and thus on the subsequent rising edge of clock signal $\phi_{Fs}$, the sampling signal $\phi_{e4}$ at the output of flip-flop 304 will go high, which is labeled as a sampling period "4" of the sampling cycle $SC_1$, and the signal $\phi_{n4}$ is high. This completes the sampling cycle $SC_1$.

During the subsequent sampling cycle $SC_2$, the sub-converter ADC0 is again tested, and thus the sequence of pulses of the signals $\phi_{e0}$ to $\phi_{e4}$ is the same as for sampling cycle $SC_1$. As indicated by interruption signs in FIG. 4, following the sampling cycle $SC_2$, there may be any number of additional sampling cycles in which the sub-converter ADC0 is tested. More generally, each converter may be tested over one or more sampling cycles.

The next sampling cycle illustrated in FIG. 4, which is the Lth sampling cycle, where L depends on the number of cycles during which the sub-converter ADC0 was tested. During the Lth sampling cycle, the sub-converter ADC1 is tested, and thus the signal $\phi_{t1}$ is high. Furthermore, multiplexers 320, 321 and 323 to 325 are controlled by control signals S0, S1 and S3 to S5 respectively to select their first inputs, while multiplexer 322 is controlled to select its second input, coupled to the output of D-type flip-flop 310. Thus, the control signals $\phi_{e1}$ and $\phi_{e2}$ have high pulses at the same time. The pulse of sampling signal $\phi_{e1}$ is a test pulse controlling sub-converter ADC1 to sample the test signal Vtest. Thus signal $\phi_{t1}$ is also high. The pulse of sampling signal $\phi_{e2}$ is a sampling period "2" of the sampling cycle $SC_L$, and thus signal $\phi_{n2}$ is high. On subsequent rising edges of the sampling signal $\phi_{Fs}$, sampling periods "3" and "4" of the sampling cycle $SC_L$ are provided by sampling signals $\phi_{e3}$ and $\phi_{e4}$, completing the sampling cycle $SC_L$.

As indicated by interruptions in FIG. 4, there may be one or more further sampling cycles in which sub-converter ADC2 is tested.

The remaining sub-converters ADC2 to ADC4 are then tested in a similar fashion by bypassing these sub-converters during the corresponding cycles and using the subsequent sub-converter in the sequence to perform the sampling operation of the input signal Vin. In particular, in the next sampling cycle $SC_Q$ shown in FIG. 4, the sub-converter ADC2 is tested for one or more sampling cycles. For the sake of brevity, the subsequent testing of sub-converter ADC3 is not illustrated in FIG. 4. Then, during a Qth sampling cycle $SC_Q$ shown in FIG. 4, the last sub-converter ADC4 is tested, and this test may continue for one or more sampling cycles, thereby completing the testing of the five sub-converters ADC0 to ADC4.

After each of the sub-converters has been tested, sampling of the input signal Vin may continue using all of the sub-converters, with each of the multiplexers 320 to 325 being controlled to select its first input. Thus, as illustrated in FIG. 4 by sampling cycle $SC_R$, the sampling periods "1" to "4" during this sampling cycles are performed by sub-converters ADC0 to ADC3 respectively, and as illustrated by the subsequent sampling cycle $SC_{R+1}$, the sampling periods "1" and "2" of the next sampling cycle are performed by sub-converters ADC4 and ADC0 respectively. An advantage of this sequence is that it is simple to implement and calibration of the sub-converters may be recommenced at any moment, without altering the operating speed of any of the sub-converters.

Figure 5:
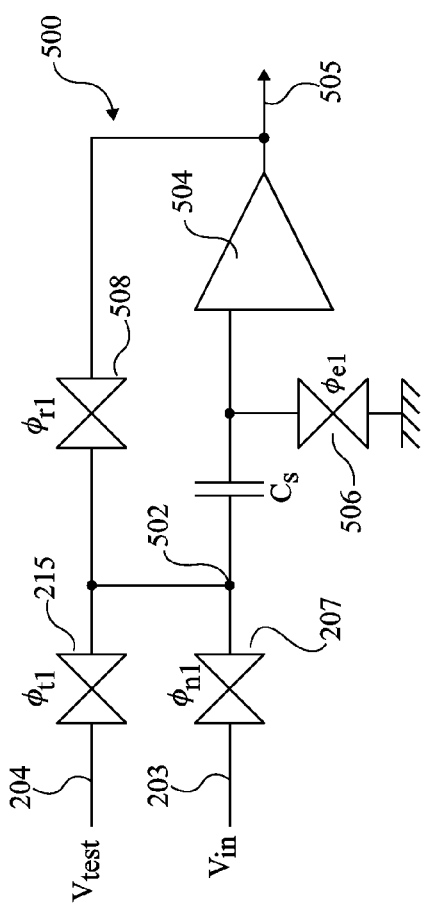
FIG. 5 illustrates input circuitry of an ADC sub-converter of FIG. 2 in more detail according to an example embodiment of the present disclosure.

FIG. 5 illustrates an example of input circuitry 500 of the sub-converter ADC1 along with the input switches 215 and 207. The other sub-converters ADC0 and ADC2 to ADC4 may comprise identical circuitry.

As shown in FIG. 5, the switches 215 and 207 are coupled into an input node 502, which is in turn coupled to the input of an operational amplifier 504, via a sampling capacitor $C_s$. The input of amplifier 504 is also coupled to ground via a sampling switch 506, which controls the sampling of the sub-converter, under the control of the sampling signal $\phi_{e1}$. The output of amplifier 504 on line 505 is for example provided to further conversion circuitry of the ADC (not shown in FIG. 5) for performing the analog to digital conversion. The output is also fed back to the input node 502 via a switch 508.

The sub-converter ADC1 has two main modes of operation: a sampling phase and a conversion phase.

During the sampling phase, the signal $\phi_{e1}$ is asserted, along with one or the other of the signals $\phi_{t1}$ and $\phi_{n1}$, depending on whether the sub-converter is to sample the input signal Vin or the test signal Vtest. During this sampling phase, switch 508 of the feedback path is non-conducting.

During the conversion phase, the input node 502 is isolated from the input lines 203 and 204 by deactivating switches 215 and 207. The sampling switch 506 is also non-conducting, and the feedback path 508 is connected, by activating transistor 508. Thus the output of the amplifier 504 matches the voltage stored on the sampling capacitor $C_s$, and is used to drive the subsequent conversion circuitry of the sub-converter ADC1. As indicated above, this conversion circuitry could be of a variety of types, such as a SAR (successive approximation register) or pipelined ADC.

FIG. 6 illustrates an interleaved ADC 600 according to a further embodiment. Those elements identical to elements of FIG. 2 have been labeled with like reference numerals, and will not be described again in detail.

Interleaved ADC 600 comprises the sub-converter block 202 and the multiplexers 205 and 222 (MUX) of FIG. 2. The test signal Vtest on line 204 is provided by a test signal generator (TEST SIGNAL GEN) 602, which is controlled by a control block (CONTROL BLOCK) 604. Test signal generator 602 also provides a test signal Vtest to one input of a switching block 605, which receives at a second input the input signal Vin, and has its output coupled to the line 203. Generator 602 is for example synchronous, and may be implemented by a phase-locked loop. Alternatively, generator 602 could be implemented by a digital to analog converter, for example with an output filter.

The test output lines 223 of multiplexer 220 of FIG. 2 comprise, in the example of FIG. 6, an output 223A coupled to a RAM (random access memory) 606, and an output 223B coupled to a RAM 608, although other types of memories could be used. RAMs 606 and 608 have outputs coupled to a calculation block (CALC BLOCK) 610, which for example provides two digital control signals on control lines 612 and 614 respectively to the sub-converter block 202.

In operation, one of the sub-converters ADC0 to ADC4 is for example selected as a golden converter, in other words as a reference to which the other sub-converters are matched. For example, ADC0 performs this role. Thus, ADC0 is for example the first ADC to be tested by the test signal Vtest, and the test data resulting from this test are stored in the RAM 606. When each of the other sub-converters ADC 1 to ADC4 is tested, the corresponding results are stored in RAM 608, and compared to the results stored in memory 606 by the calculation block 610 in order to generate the control signals on lines 612 and/or 614.

The test signal Vtest is for example a periodic signal, which could have the form of a sinusoid, or other forms such as a triangular or sawtooth wave.

The test signal generator 602 of FIG. 6 for example allows static skew and/or bandwidth measurements to be made in each of the sub-converters ADC0 to ADC4.

For testing static skew, the test signal Vtest is for example provided to the sub-converter under test via the line 204.

The bandwidth of each sub-converter results, at least to some extent, from the resistive and capacitive elements of the switches of multiplexer 205. Given that bandwidth variations may affect the skew measurements, the bandwidth of the test path via line 204 is for example tested for each sub-converter ADC0 to ADC4. However, for measuring bandwidth of the path of the input signal Vin, the test signal is for example provided to the sub-converter under test via the line 203, i.e., via the switch 207 of FIG. 4 that is used for receiving the actual signal Vin to be converted. The switching block 605 is controlled by a control signal S to connect the test signal Vtest to the line 203 when the bandwidth test is to be performed. The switching block 605 is for example configured to have a low impedance output that is independent of the input that is selected. For example, the switching block 605 comprises an amplifier. Of course, during this test period the interleaved ADC is for example in a calibration mode during which it does not convert the input signal Vin.

To test bandwidth, some relatively high frequencies $f_{test}$ of the test signal Vtest are for example generated by the test signal generator 602, and attenuation of the signal by each sub-converter under test for a range of said frequencies is for example compared to the attenuation of the signal resulting from the same test signal applied to the reference sub-converter ADC0.

Static skew results from a difference in the time delay of the sampling signal provided to each sub-converter. In one example, the static skew is estimated and corrected as follows using a sinusoidal test signal.

After applying a sinusoidal test signal Vtest to the reference sub-converter, and processing the resulting test data Dtest to extract any offset, the reference signal x(t) can be assumed to have the following equation:

$$x(t)=a_0*\sin(2*\pi*f*t)$$

where $a_0$ is the gain of the reference sub-converter, which is sub-converter ADC0 in this example, f is the frequency of the sinusoid test signal, and t is the time of the sample. The number of samples of the test signal will depend on the factors such as the noise in the system, and could be several thousand or more.

Then, using a similar process for the sub-converter ADCn to be tested, the output data can be assumed to have the following equation:

$$y_n(t)=a_n*\sin(2*\pi*f*(t+n*T_e+\delta t_n))$$

where $a_n$ is the gain of the sub-converter n, f is the frequency of the sinusoid test signal, t is the time of the sample, $T_e$ is the ideal time delay between sampling periods, i.e., the period of the clock signal $\phi_{Fs}$, and $\delta t_n$ is the time skew of sub-converter ADCn with respect to the reference converter ADC0. The number of samples of the test signal taken by each of the sub-converters ADCn is for example the same as the number used to test the reference converter ADC0.

The multiplication of signals x(t) by y(t) will result in a signal comprising the sum of frequencies and difference of frequencies of these signals. Thus, based on the mean z=mean $(x*y/a_0*a_n)$ of this sum for a whole number of periods, the value of $\delta t_n$ can be determined as follows:

$$\delta t_n=1/(2*\pi*f)*\arccos(2*z)-nT_e$$

This test is for example preformed for a relatively low frequency test signal, for example in a frequency range of 300 to 400 MHz, and then repeated for a relatively high frequency test signal, for example in a frequency range of 1 GHz or more.

Examples of calibration circuitry of the sub-converter ADC1 will now be described with reference to FIGS. 7A and 7B. Similar circuitry could be provided in the other sub-converters ADC0 and ADC2 to ADC4.

FIG. 7A illustrates an example of calibration circuitry 700 of the sub-converter ADC1 for adjusting the sampling time of signal $\phi_{e1}$ provided to the switch 506 of FIG. 5 based on the control signal from the calculation block 610 of FIG. 6. This allows a skew mismatch to be corrected. In particular, a programmable delay (PROGRAMABLE DELAY) 702 is coupled in the path of the sampling signal $\phi_{e1}$, which allows a delay to be selected, for example by coupling one or more inverters into the delay path. The selection is performed via one or both of digital and analog control signals. The digital control signal is for example provided directly by the digital control lines 612 from the calculation block 610, while the analog control signal is provided by a digital to analog converter (DAC) 706, which converts the digital signal on line 612 to an analog control signal. For example, the digital control signal provides a rough control of the delay, and the analog control signal provides fine control of the delay.

FIG. 7B illustrates a further example of calibration circuitry 750 of the sub-converter ADC1 according to a further example, which may be included as an alternative or in addition to the circuitry 700. The circuitry 750 provides bandwidth compensation, for example to both the path of the input voltage Vin, and also the path of the test signal Vtest.

As mentioned above, the bandwidth of each sub-converter ADC0 to ADC4 is determined to at least some extent by the resistive and capacitive elements of the input circuitry 500, which effectively result in an RC filter. Bandwidth compensation is for example applied to the input circuitry of the input signal Vin using a control block (CTRL VBULK) 752, which controls the bulk voltage Vbulk of the input transistor 207 of ADC1 based on the digital control signal on lines 612 from the calculation block 610 of FIG. 6. Thus the control block 752 for example comprises a digital to analog converter, and/or other circuitry for generating the analog voltage level to be applied the bulk node of transistor 207. Transistor 207 is coupled between the input line 203 supplying the input signal Vin and the input circuitry 500 of FIG. 5. By varying its bulk voltage, its on resistance Ron may also be varied, leading to a modification of the pass band of the converter.

The gate node of transistor 207 is for example controlled by an optional bootstrap circuit (BOOTSTRAP) 754 coupled between the gate node and the supply voltage $V_{DD}$. The bootstrap circuit is activated by the control signal $\phi_{n2}$ to apply a gate voltage to the gate node of transistor 207.

In a similar fashion, bandwidth compensation may be applied to the input circuitry of the test signal Vtest using a control block (CTRL VBULK) 756, which controls the bulk voltage Vbulk of the input transistor 215 of ADC1 based on the digital control signal on lines 612 from the calculation block 610 of FIG. 6. Thus the control block 756 for example comprises a digital to analog converter, and/or other circuitry for generating the analog voltage level to be applied the bulk node of transistor 215. Transistor 215 is coupled between the input line 204 supplying the test signal Vtest and the input circuitry 500 of FIG. 5. By varying its bulk voltage, its on resistance Ron may also be varied, leading to a modification of the pass band of test circuitry of the converter. While not shown in FIG. 7B, the gate node of transistor 215 may be controlled by a bootstrap circuit in a similar fashion to transistor 207.

FIG. 8 illustrates an electronic device 800 comprising an interleaved ADC 802, which is for example the ADC 200 of FIG. 2 or the ADC 600 of FIG. 6. The electronic device 800 is for example a portable device such as a mobile phone, laptop computer, digital camera, portable games console or the like, or other type of electronic device that includes processing circuitry 804.

An advantage of modifying the bulk voltage of the input switch of a sub-converter of the interleaved ADC is that the bandwidth of the sub-converter can be modified, thereby leading to an improved matching between the sub-converters. Furthermore, this calibration method and circuit may be implemented in a simple fashion, without adversely affecting other parameters of the sub-converter, such as static skew.

An advantage of the embodiments described herein for controlling the sampling of the sub-converters is that one or more sub-converters may be bypassed in order to allow it to be tested, without risk of altering the characteristics of the sampling signal when it is routed to a different converter. Furthermore, the interleaved ADC may continue to operate normally during the test of each sub-converter, without a reduction in performance.

Having thus described at least one illustrative embodiment of the disclosure, various alterations, modifications and improvements will readily occur to those skilled in the art.

For example, it will be appreciated by those skilled in the art that numerous variations may be applied to the circuits described in relation to the various embodiments.

For example, while the various switches are represented as MOS transistor, other transistor technology may be used. Furthermore, it will be apparent to those skilled in the art that the flip-flops 300 to 304 of FIG. 3 could be omitted, the sampling signals $\phi_{e0}$ to $\phi_{e4}$ being provided directly by the outputs of flip-flops 310 to 314.

Furthermore, it will be apparent to those skilled in the art that the memories 606 and 608 of FIG. 6 could be implemented by separate memory devices such as random access memories (RAMs), or by a single RAM. Furthermore, it will be apparent to those skilled in the art that the features described in relation to the various embodiments may, in alternative embodiments, be combined in any combination, and that the functional blocks of the various embodiments could be implemented in hardware, software or any combination thereof.

Such alterations, modifications, and improvements are intended to be part of this disclosure, and are intended to be within the spirit and the scope of the present disclosure. Accordingly, the foregoing description is by way of example only and is not intended to be limiting.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. A device, comprising:
an interleaved analog to digital converter (ADC) having:
a first switching circuit coupled to an input line of the ADC;
a first sub-converter coupled to the first switching circuit;
a second sub-converter coupled to the first switching circuit;
calibration circuitry configured to adjust a bandwidth of at least one of the first and the second sub-converter, the calibration circuitry including:
a test signal generator configured to generate a test signal to test the bandwidth of at least one of the first and the second sub-converter, the test signal having a test frequency and configured to be applied to at least one of the first and second sub-converter; and
a first control circuit configured to adjust a bulk voltage of a transistor in the first switching circuit in response to the test of the bandwidth of at least one of the first and the second sub-converter; and
a calculation block configured to compare test data of the first and second sub-converters, and to provide a control signal to said first control circuit based on said comparison, wherein the first control circuit is configured to adjust the bulk voltage based on the control signal.

2. The device of claim 1, further comprising:
a first memory coupled to said calculation block and configured to store the test data from the first sub-converter, and a second memory coupled to said calculation block and configured to store the test data from the second sub-converter, wherein the calculation block is configured to obtain the test data from the first and second memories.

3. The device of claim 1, further comprising a bootstrap circuit configured to provide a gate voltage to a gate of a first transistor in the first switching circuit based on a timing signal.

4. The device of claim 1, wherein said input line is configured to receive an input signal of said interleaved ADC, and said interleaved ADC includes:
a second switching circuit coupled to the first sub-converter and the second sub-converter and configured to receive a test signal; and
a second control circuit configured to adjust a bulk voltage of a transistor in the second switching circuit.

5. The device of claim 1, wherein said test signal generator comprises at least one of:
a phase-locked loop; and
a digital to analog converter.

6. The device of claim 5, further comprising a switching block adapted to select between said test signal and an input signal, and to apply the selected signal to at least one of the first and second sub-converter.

7. The device of claim 1, further comprising:
a bootstrap circuit coupled to the transistor of the first switching circuit between a supply voltage and a gate of the transistor, the bootstrap circuit being configured to activate the transistor in response to a timing signal, the timing signal being based on a clock pulse.

8. A method, comprising:
calibrating a bandwidth of at least one a first and a second sub-converter of an interleaved analog to digital converter, the first and second sub-converter being coupled to a first switching circuit, respectively, the first switching circuit each being coupled to an input line of said ADC, the calibrating comprising:
testing the bandwidth of at least one of the first and the second sub-converter by generating a test signal, the test signal having a test frequency;
applying the test signal to at least one of the first and second sub-converter; and
adjusting a bulk voltage of a transistor in the first switching circuit in response to the testing of the bandwidth, the adjusting including:
generating an adjustment control signal in a calculation block from outputs of the first and second sub-converters in response to the test signal;

receiving the adjustment control signal at a control block; and providing a bulk control signal from the control block to the transistors.

9. The method of claim 8, further comprising:

generating an analog bulk control signal in the control block from a digital to analog converter, the converter configured to receive the adjustment control signal.

10. The method of claim 8, further comprising:

controlling a gate of the transistor with a bootstrap circuit coupled between the gate and a supply voltage.

11. A device, comprising:

an interleaved analog to digital converter (ADC) having:
- a switching circuit coupled to input lines of the ADC;
- a first sub-converter coupled to the switching circuit;
- a second sub-converter coupled to the switching circuit, the switching circuit including a first transistor configured to receive a test signal and coupled between the first sub-converter and a test input line of the interleaved ADC, and a second transistor configured to receive an input signal and coupled between the first sub-converter and an sample input line of the interleaved ADC;

a calculation block configured to generate an adjustment control signal in response to outputs of the first and second sub-converters;

calibration circuitry configured to adjust a sampling time of at least one of the first and the second sub-converter, the calibration circuitry including:
- a delay circuit coupled between the calculation block and the first and second sub-converters and configured to receive the adjustment control signal and to provide a delayed adjustment control signal.

12. The device of claim 11, wherein the switching circuit includes:
- a common node between the first transistor and the second transistor;
- an amplifier coupled between the common node and the first sub-converter;
- a third transistor coupled between the common node and ground.

13. The device of claim 12, wherein the calculation block is configured to generate a bulk control signal in response to outputs from the first and second sub-converters, the bulk control signal being configured to adjust a bulk voltage of at least one of the first and second transistor of the switching circuit.

14. The device of claim 11, further comprising:
- a control circuit configured to generate sampling control signals from a sampling frequency, the control circuit being coupled to the first and the second sub-converters and being configured to control a sampling rate of the first and the second sub-converters.

* * * * *